(12) United States Patent
Huang et al.

(10) Patent No.: US 6,525,942 B2
(45) Date of Patent: Feb. 25, 2003

(54) HEAT DISSIPATION BALL GRID ARRAY PACKAGE

(75) Inventors: Chien-Ping Huang, Hsinchu Hsien (TW); Tzong-Dar Her, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 7 days.

(21) Appl. No.: 09/860,421

(22) Filed: May 18, 2001

(65) Prior Publication Data

US 2002/0034066 A1 Mar. 21, 2002

(30) Foreign Application Priority Data

Sep. 19, 2000 (TW) .......................................... 89119205

(51) Int. Cl.$^7$ ................................................. H05K 7/20
(52) U.S. Cl. ........................ 361/704; 361/705; 361/707; 165/80.3; 257/706; 257/707
(58) Field of Search ................................. 361/704, 705, 361/707, 712, 717–719, 722; 165/80.2, 80.3, 80.4, 185; 174/52.2, 52.4, 252; 257/706, 707, 713, 720, 738, 780, 796; 438/106, 116, 125, 126; 29/830, 840, 843, 846; 228/180.21, 180.22

(56) References Cited

U.S. PATENT DOCUMENTS

| | | | | |
|---|---|---|---|---|
| 5,307,237 A | * | 4/1994 | Walz | 361/718 |
| 5,490,324 A | * | 2/1996 | Newman | 29/830 |
| 5,640,047 A | * | 6/1997 | Nakashima | 257/738 |
| 5,642,261 A | * | 6/1997 | Bond et al. | 361/704 |
| 5,710,459 A | * | 1/1998 | Teng et al. | 257/717 |
| 5,741,729 A | * | 4/1998 | Selna | 438/125 |
| 5,825,628 A | * | 10/1998 | Garbelli et al. | 361/763 |
| 5,894,410 A | * | 4/1999 | Barrow | 361/760 |
| 5,990,550 A | * | 11/1999 | Umezawa | 257/712 |
| 6,282,094 B1 | * | 8/2001 | Lo et al. | 361/704 |
| 6,359,341 B1 | * | 3/2002 | Huang et al. | 257/778 |
| 6,448,639 B1 | * | 9/2002 | Ma | 257/691 |

* cited by examiner

Primary Examiner—Darren Schuberg
Assistant Examiner—Michael Datskovsky
(74) Attorney, Agent, or Firm—J.C. Patents

(57) ABSTRACT

A heat dissipation ball grid array package includes the following elements. A plurality of first thermal ball pads is formed on the underside of a substrate in the area covered by chip. A plurality of second thermal ball pads or a heat dissipation ring is formed outside the first thermal ball pads. A plurality of signal ball pads is formed outside the second thermal ball pads or the heat dissipation ring. The second thermal ball pads or heat dissipation ring is connected to the first thermal ball pads by conductive trace lines. A plurality of first thermal balls is attached to the respective first thermal ball pads. The signal balls are attached to the respective signal ball pads. The first thermal balls and the signal balls are in contact with corresponding contact points on a printed circuit board. A plurality of second thermal balls is attached to the respective second thermal ball pads or the surface of the heat dissipation ring.

15 Claims, 4 Drawing Sheets

HEAT DISSIPATION BALL GRID ARRAY PACKAGE

CROSS-REFERENCE TO RELATED APPLICATION

This application claims the priority benefit of Taiwan application serial no. 89119205, filed Sep. 19, 2000.

BACKGROUND OF THE INVENTION

1. Field of Invention

The present invention relates to a ball grid array package. More particularly, the present invention relates to a ball grid array package having a heat dissipation structure therein.

2. Description of Related Art

The development of semiconductor devices is always aiming towards a higher level of integration and a higher density package so that more functions can be packed inside each electronic product. Due to a rapid increase in the data processing speed, the signal frequency of each semiconductor device is higher. Together with a high level of packing density within a semiconductor package, the amount of heat generated per unit time per unit volume is increased considerably. Consequently, how to increase the heat dissipation rate of a package has become an important topic in the semiconductor production circle.

Ball grid array (BGA) is a type of package capable of providing a high pin count connection with external devices. Since solder balls are used in a BGA package, the signal path is greatly reduced and hence widely adopted by the integrated circuit package industry. However, most BGA package has a high pin count and has a high heat output. Hence, increasing the heat dissipation rate of a BGA package has been a major topic of research for some time. In addition, most BGA packages use laminated boards as carriers. Since the coefficient of thermal expansion (CTE) between the silicon chip and the laminated board is rather different, package deformation can be frequent. This will not only lead to a large thermal stress on the solder balls, but will also lead tosolder ball joint failure after a few thermal cycles.

As disclosed in U.S. Pat. No. 5,216,278, the heat generated from the chip is dissipated from the die pad, vias and thermal balls to the printed circuit board. However, the number and the arrangement of these thermal balls are limited. As disclosed in U.S. Pat. No. 5,894,410, the thermal balls are arranged within the area covered by the chip except the edge region of the chip in order to reduce the influence of the stress on the thermal balls.

FIG. 1 is a schematic cross-sectional diagram of a conventional ball grid array. As disclosed in U.S. Pat. Nos. 5,216,278 and 5,894,410, a conventional ball grid array package 100 is build upon a laminated board 102. The laminated board 102 is constructed out of a multiple of patterned trace layers 104 and 106 and an insulation layer 108 stacking over each other. The patterned trace layer 104 includes a die pad 110 and other trace lines. The backside 124 of a silicon chip 120 is attached by an adhesive material 112 to the die pad 110. The bonding pads 126 on the active surface 122 of the chip 120 are electrically connected to the patterned trace layer 104 by gold wires 114. Molding compound 134 encapsulates the chip 120 and the junction between the chip 120 and the patterned trace layer 104. The patterned trace layer 106 has a plurality of ball pads 116 and 118 for attaching solder balls 130 and 132. The solder balls 130 are used for transmitting electrical signals and are attached to the contacts 142 of a printed circuit board (PCB) 140. The ball pads 116 are electrically connected to other lines in the patterned trace layer 104 by vias 146. A plurality of vias 148 each passing through the laminated board 102 and in connection with the ball pads 118 is generally formed under the die pad 110. The main purpose of the solder balls 132 is to dissipate heat away by transferring the heat to the heat dissipation points 144 on the printed circuit board 140. The solder balls 132 mainly serve as ground or power source contacts. Thus in a conventional BGA package, the number and the arrangement of the thermal balls are limited. Hence, the quantity of heat capable of being dissipated is quite limited and may not be large enough to carry away all the heat generated in a high heat generation package. Furthermore, these thermal balls are normally placed within the area covered by the chip and set a distance away from the edge region of the chip. Hence, the solder balls in the package are not arranged in a full area array.

SUMMARY OF THE INVENTION

Accordingly, one object of the present invention is to provide a ball grid array (BGA) package with improved heat dissipation.

Another object of the present invention is to provide a ball grid array (BGA) package having solder balls arranged in a full area array, which results in improved heat dissipation.

Still another object of the present invention is to provide a ball grid array (BGA) package in which the thermal balls can be arranged on the whole lower surface of the package, including the edge region of the chip so that solder ball joint failure will not occur.

Still another object of the present invention is to provide a heat dissipation type of ball grid array (BGA) package. The package has solder balls inserted into the space between the underside of a silicon chip and the signal balls of the package. In addition, through conductive trace lines to thermal balls connection, another heat dissipation path is provided so that the heat dissipation rate is increased.

Still another object of the invention is to provide a heat dissipation ball grid array package by having a dissipation ring around the periphery on the underside of a silicon chip. Moreover, solder balls are attached to the dissipation ring as another heat dissipation path, and thereby increasing the heat dissipation capacity of the package.

To achieve these and other advantages in accordance with the purpose of the invention, as embodied and broadly described herein, the invention provides a heat dissipation ball grid array (BGA) package. The BGA package includes a substrate having a plurality of patterned trace layers and an insulation layer between neighboring patterned trace layers. The first patterned trace layer on the upper surface of the substrate has a die pad. The second patterned trace layer on the lower surface of the substrate has signal ball pads, first thermal ball pads, second thermal ball pads and conductive trace lines. The first thermal ball pads and the second thermal ball pads are connected by conductive trace lines. The insulation layer has signal vias and thermal conductive vias. The patterned trace layers are electrically connected by the signal vias. The thermal conductive vias link up the die pad and the first thermal ball pads thermally. The backside of the chip is attached to the die pad and the chip is electrically connected to the first patterned trace line. The first thermal ball pads are positioned inside the area covered by the chip. The second thermal ball pads and the signal ball pads are positioned outside the area covered by the chip. Molding compound encapsulates the chip and the junction between the chip and the first patterned trace layer. The signal balls are attached to the signal ball pads. The signal balls are also in contact with some of the contact points on a printed circuit board. First thermal balls are attached to the first thermal ball pads. The first thermal balls are in thermal contact with contact points on the printed circuit board. Second thermal balls are attached to the second thermal ball pads.

According to one preferred embodiment of this invention, the second thermal ball pads can connect with the die pad by a thermal via. The second thermal ball pad can be extended and combined to form a heat dissipation ring located just outside the area covered by the chip. The second thermal balls is further capable of connecting with the contact point on the printed circuit board so that more heat can be conducted away through the printed circuit board. Alternatively, the second thermal balls and the printed circuit board has no direct thermal connection so that heat may be dissipated by thermal convection. Because the second thermal balls and the thermal ring are located outside the area covered by the chip, another path for heat dissipation is created. Since area for heat dissipation is increased, overall heat dissipation rate of a package of standard volume is also increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
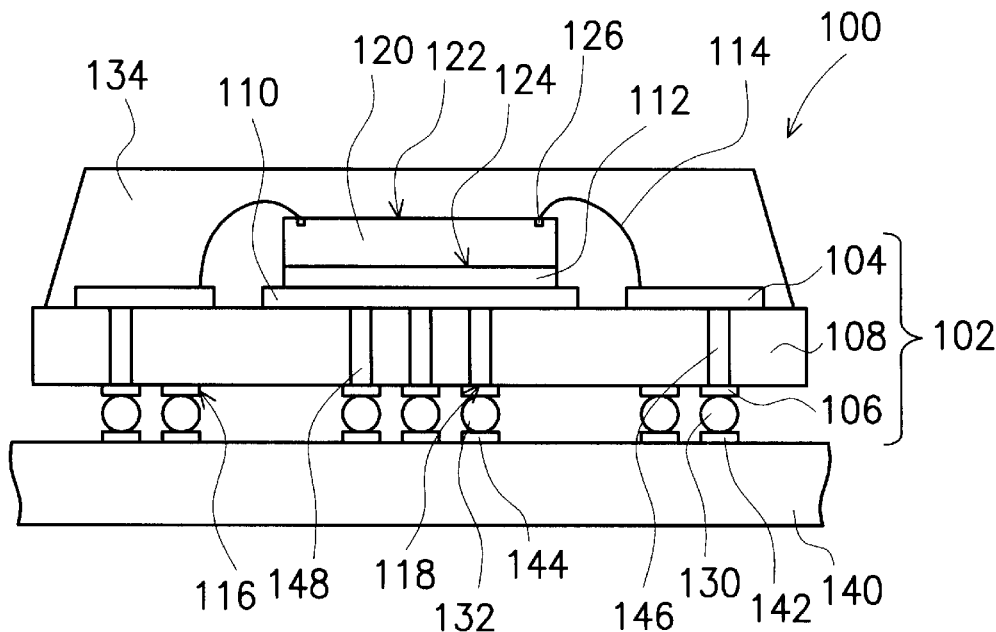
FIG. 1 is a schematic cross-sectional diagram of a conventional ball grid array.

Reference will now be made in detail to the present preferred embodiments of the invention, examples of which are illustrated in the accompanying drawings. Wherever possible, the same reference numbers are used in the drawings and the description to refer to the same or like parts.

Figure 2:
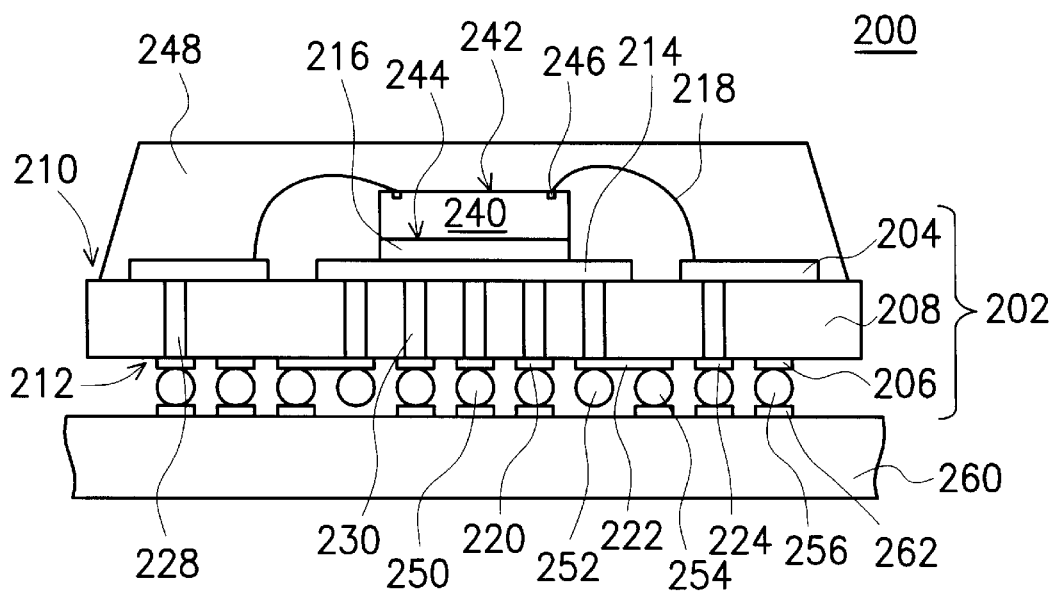
FIG. 2 is a schematic cross-sectional diagram of a heat dissipation ball grid array package according to a first preferred embodiment of this invention.
Figure 3:
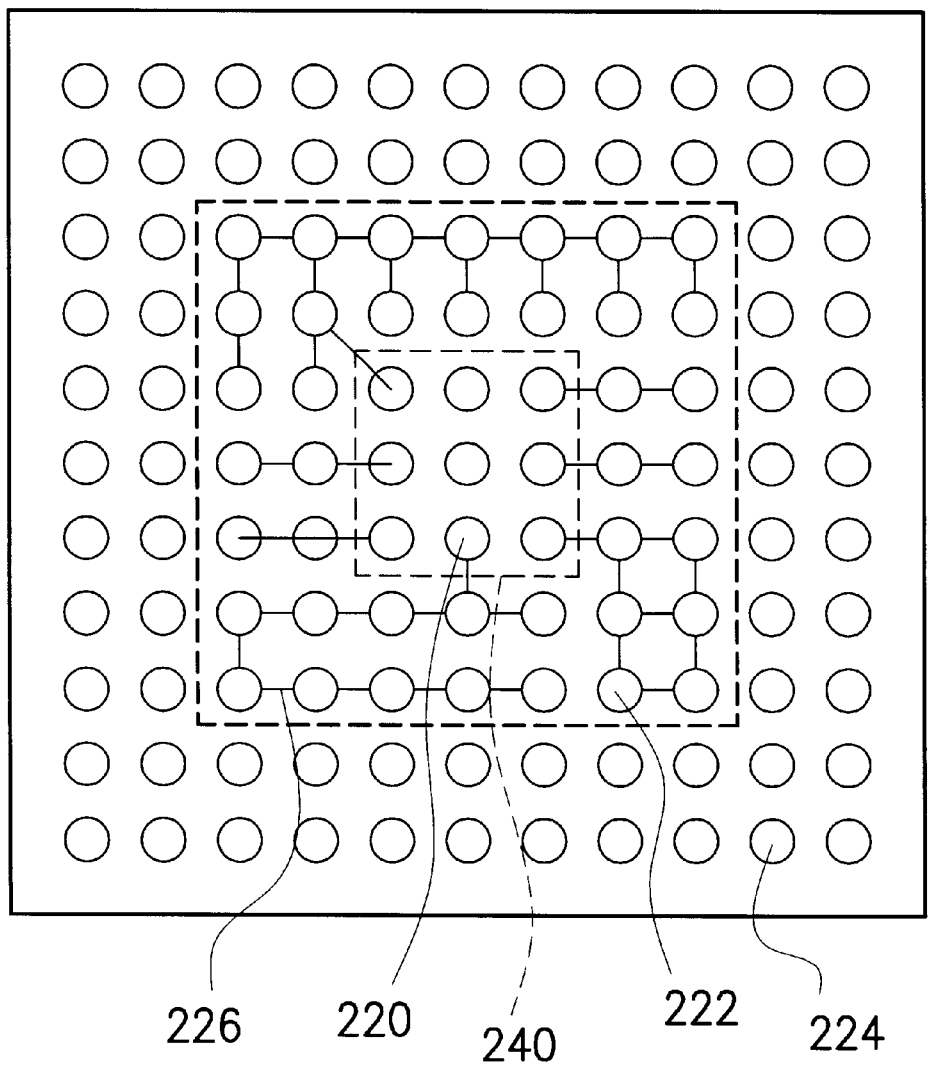
FIG. 3 is a bottom view of the underside of the substrate shown in FIG. 2.

FIG. 2 is a schematic cross-sectional diagram of a heat dissipation ball grid array package according to a first preferred embodiment of this invention. FIG. 3 is a bottom view of the underside of the substrate shown in FIG. 2. As shown in FIGS. 2 and 3, the ball grid array (BGA) package 200 in the first embodiment of this invention uses a substrate 202 such as a laminated board. The laminated board is constructed out of a plurality of insulation layers 208 and a plurality of patterned trace layers 204 and 206 stacking over each other alternately. The insulation layer 208 can be made from a material including glass epoxy resins (FR-4, FR-5), bismaleimide-triazine (BT) or epoxy resin. The insulation layer 208 is formed between two patterned trace layers for electrical isolation. The patterned trace layers 204 and 206 are formed by photolithographic and etching of copper foils. To simplify explanation, only the first patterned trace layer 204 on the first surface 210 (the upper surface) and the second patterned trace layer 206 on the second surface 212 (the lower surface) of the substrate 202 are shown. The first patterned trace layer 204 has a die pad 214 and some other circuit lines including gold fingers for connecting with a chip 240. The chip 240 has an active surface 242 and a back surface 244. The active surface 242 has a plurality of bonding pads 246, which are contact points for connecting internal circuits of chip 240 to external circuits. The back surface 244 of the chip 240 is attached to a die pad 214 by adhesive material 216. The adhesive material 216 is preferably a good heat conductor. The bonding pads 246 are electrically connected to the first patterned trace layer 204 by conductive wires 218 such as gold or aluminum wires. A molding compound 248 such as an epoxy is used to encapsulate the chip 240 and the junction area between the chip 240 and the first patterned trace layer 204.

The second patterned trace layer 206 has first thermal ball pads 220 within the area covered by the chip 240, second thermal ball pads 222 outside the area covered by the chip 240. The conductive trace lines 226 connect the first thermal ball pads 220 and the second thermal ball pads 222, and signal ball pads 224 are outside the second thermal ball pads 222. The patterned trace layers 204 and 206 are electrically connected by signal vias 228. A plurality of thermal conductive vias 230 is formed underneath the die pad 214. The thermal conductive vias 230 are formed by directly plugging through the substrate 202, thereby forming a conductive thermal link with the first thermal ball pad 220. Thermally, the second thermal ball pads 222 and the die pad 214 are indirectly linked by the conductive trace lines 226 and the first thermal ball pad 220. However, the second thermal ball pads 222 and the die pad 214 are also directly linked by a portion of the thermal conductive vias 230.

The second surface 212 of the BGA package has a plurality of solder balls implanted for connecting with contacts 262 on a printed circuit board 260, thereby forming electrical connections or thermal conductive junctions. The solder balls are made from a material including a lead-tin alloy or copper. First thermal balls 250 are attached to the respective first thermal ball pads 220 and corresponding contacts 262 on the printed circuit board 260. Besides transferring the heat generated by the chip 240 away to the printed circuit board 260, the solder balls also form an electrical connection between the printed circuit board 260 and the chip 240 serving as ground or power point connections. Signal balls 256 are attached to the signal ball pads 224 and corresponding contacts 262 on the printed circuit board 260, thereby forming electrical connections for signal transmission such as input/output signals. Second thermal balls 252 and 254 are attached to the second thermal ball pads 222. The second thermal balls 252 and 254 can be selectively attached to the contacts 262 on the printed circuit board 260 (for example, the second thermal ball 254). The second thermal balls 252 and 254 dissipate the heat generated by the chip 240 to the printed circuit board 260, thereby providing another heat dissipation route. Alternatively, no contact with the printed circuit board 260 is formed by the second thermal ball 252. Without contact, the heat dissipation area is increased and hence heat may be removed by convection. In addition, by separating the second thermal ball 252 from the printed circuit board 260, undesirable thermal stress is removed and hence reliability of the package can be improved.

Thus the thermal balls can be arranged within the area covered by the chip, including the edge region of the chip. That is, the thermal balls can be arranged in a full area array. Thus the number of the thermal balls is not limited and the efficiency of heat dissipating can be improved.

Figure 4:
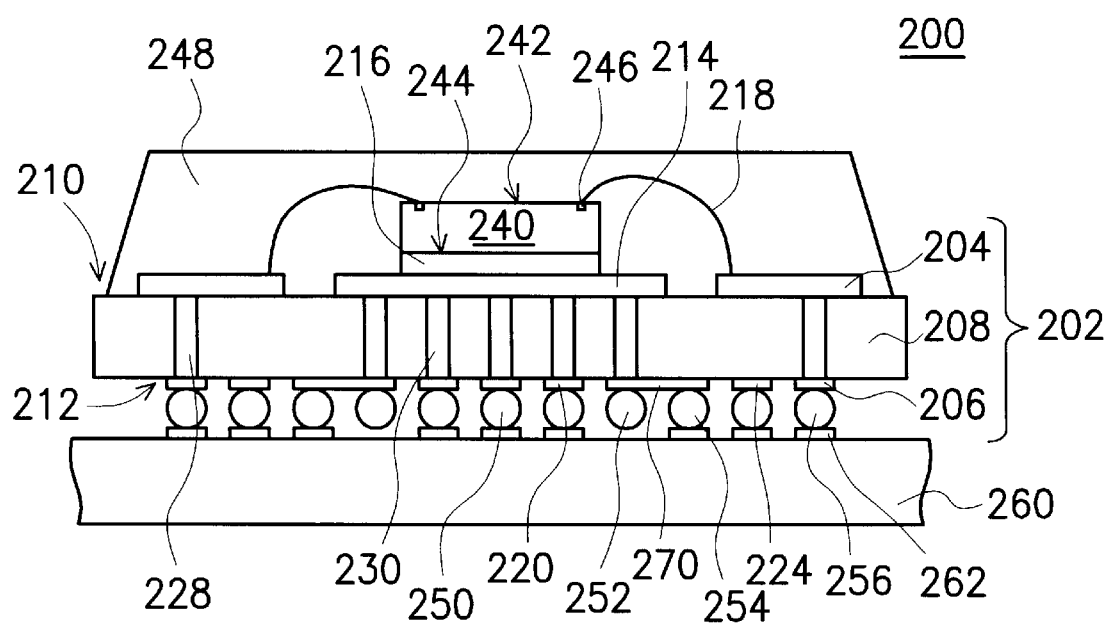
FIG. 4 is a schematic cross-sectional diagram of a heat dissipation ball grid array package according to a second preferred embodiment of this invention.
Figure 5:
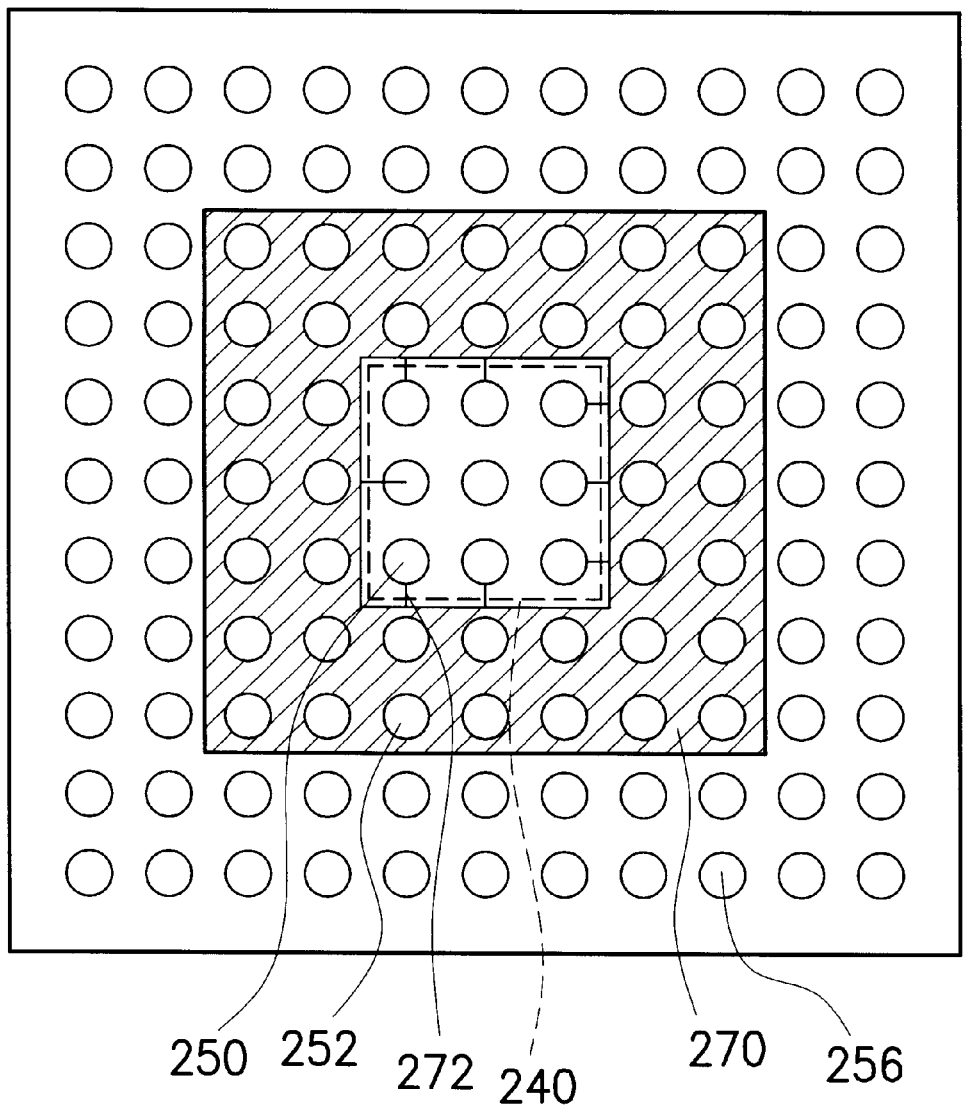
FIG. 5 is a bottom view of the underside of the substrate shown in FIG. 4.

FIG. 4 is a schematic cross-sectional diagram of a heat dissipation ball grid array package according to a second preferred embodiment of this invention. FIG. 5 is a bottom view of the underside of the substrate shown in FIG. 4. As shown in FIGS. 4 and 5, a major difference between the first embodiment and this embodiment of the invention is that the second thermal ball pads are extended and joined together to form a thermal dissipation ring 270. The ring 270 covers an area outside the chip 240 region. In addition, the ring 270 is thermally linked either directly or indirectly with the die pad 214 by a conductive trace line 272 or a thermal conductive via 230. Second thermal balls 252 and 254 are also mounted on the surface of the heat dissipation ring 270. Moreover, the thermal balls 252 and 254 may connect with the contacts 262 on the printed circuit board 260 selectively. In addition, the thermal balls 252 and 254 may be alternately positioned, instead of in a close packed array, so that more convection current can flow between them and bring out the heat. The aforementioned addition of heat dissipation ring and the arrangement of the second thermal balls not only enable a full utilization of the bottom surface of the package, but also increase overall heat dissipation per unit volume.

In summary, the advantages of the invention include at least:

1. In the present invention, the arrangement of the thermal balls includes the edge region of the chip so that solder ball joint failure will not occur.

2. In the present invention, the solder balls are arranged in a full area array. This arrangement improves the efficiency of heat dissipation.

3. The BGA of this invention has solder balls in the space between the underside of the chip and the signal balls. Through conductive trace lines and thermal ball connections, another heat dissipation route is created so that the heat dissipation rate is increased.

4. By forming a heat dissipation ring on the bottom side around the chip and attaching solder balls on the surface of the ring, another thermal conductive path is created to increase thermal dissipation.

5. The second thermal balls can be selectively not attached to the printed circuit board so that some thermal stress is relieved. In addition, a convection current may form so that more heat can be carried away.

6. The addition of a heat dissipation ring and the second thermal balls increase the overall heat dissipating area. The combination of thermal conduction and convection increase the overall heat dissipation of the BGA package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation ball grid array (BGA) package for attaching to the surface of a printed circuit board having a plurality of contacts, comprising:

a substrate having a first surface and a corresponding second surface, including:
   a plurality of patterned trace layers, wherein a first patterned trace layer is on the first surface and a second patterned trace layer is on the second surface, the first patterned trace layer has at least a die pad, the second patterned trace layer has a plurality of signal ball pads, a plurality of first thermal ball pads, a plurality of second thermal ball pads and a plurality of conductive trace lines, the first thermal ball pads and the second thermal ball pads are electrically connected by the conductive trace lines; and
   at least one insulation layer between any pair of neighboring patterned trace layers for electrically isolating the two trace layers, wherein the insulation layer has at least a plurality of signal vias and a plurality of thermal conductive vias, the patterned trace layers are electrically connected by the signal vias, and the die pad and the first thermal ball pads are thermally connected by the thermal conductive vias;

a silicon chip having a first active surface and a back surface, wherein the back surface of the chip is attached to the die pad and the chip is electrically connected with the first patterned trace layer, the first thermal ball pads are positioned within the area covered by the chip, and the second thermal ball pads and the signal ball pads are positioned outside the area covered by the chip;

a molding compound that encapsulates the chip and the junction area between the chip and the first patterned trace layer;

a plurality of signal balls attached to the respective signal ball pads, wherein the signal balls are also attached to some of the contacts on the printed circuit board;

a plurality of first thermal balls attached to the respective first thermal ball pads, wherein some of the first thermal balls are also attached to the thermal contacts on the printed circuit board; and a plurality of second thermal balls attached to the respective second thermal ball pads.

2. The BGA package of claim 1, wherein the second thermal balls are at a distance from the printed circuit board.

3. The BGA package of claim 1, wherein some of the second thermal balls are in contact with the thermal contacts on the printed circuit board while the other second thermal balls are at a distance from the printed circuit board.

4. The BGA package of claim 1, wherein some of the second thermal ball pads are thermally connected to the die pad by a few of the thermal conductive vias.

5. The BGA package of claim 1, wherein material forming the insulation layer is selected from a group consisting of glass epoxy resins (FR-4, FR-5), bismaleimide-triazine (BT) and epoxy resin.

6. The BGA package of claim 1, wherein the chip, the first thermal ball pads and the second thermal ball pads are electrically connected together and the contact points of the first thermal balls and the second thermal balls are connected to a ground.

7. The BGA package of claim 1, wherein the chip, the first thermal ball pads and the second thermal ball pads are electrically connected together and the contact points of the first thermal balls and the second thermal balls are connected to a power source.

8. The BGA package of claim 1, wherein the second thermal ball pads and the conductive trace lines that connect with the second thermal ball pads are combined together to form a heat dissipation ring located on the second surface outside the die pad area, and the heat dissipation ring is also thermally connected to the first thermal ball pads.

9. A heat dissipation ball grid array (BGA) package for attaching to the surface of a printed circuit board having a plurality of contacts, comprising:

a substrate having a first surface and a corresponding second surface, including:
  a plurality of patterned trace layers, wherein a first patterned trace layer is on the first surface and a second patterned trace layer is on the second surface, the first patterned trace layer has at least a die pad, the second patterned trace layer has a plurality of signal ball pads, a plurality of thermal ball pads and a heat dissipation ring, and the thermal balls are connected to the heat dissipation ring; and
  at least one insulation layer between any pair of neighboring patterned trace layers for electrically isolating the two trace layers, wherein the insulation layer has at least a plurality of signal vias and a plurality of thermal conductive vias, the patterned trace layers are electrically connected by the signal vias, and the die pad and the thermal ball pads are thermally connected by the thermal conductive vias;

a silicon chip having a first active surface and a back surface, wherein the back surface of the chip is attached to the die pad and the chip is electrically connected with the first patterned trace layer, the thermal ball pads are positioned within the area covered by the chip, the heat dissipation ring are positioned outside the area covered by the chip, and the signal balls are positioned outside the heat dissipation ring;

a molding compound that encapsulates the chip and the junction area between the chip and the first patterned trace layer;

a plurality of signal balls attached to the respective signal ball pads, wherein the signal balls are also electrically connected to some of the contacts on the printed circuit board;

a plurality of first thermal balls attached to the respective thermal ball pads, wherein some of the first thermal balls are also attached to the thermal contacts on the printed circuit board; and a plurality of second thermal balls attached to the heat dissipation ring.

10. The BGA package of claim 9, wherein the second thermal balls are at a distance from the printed circuit board.

11. The BGA package of claim 9, wherein some of the second thermal balls are in contact with the thermal contacts on the printed circuit board while the other second thermal balls are at a distance from the printed circuit board.

12. The BGA package of claim 9, wherein the heat dissipation ring is thermally connected to the die pad by a few of the thermal conductive vias.

13. The BGA package of claim 9, wherein material forming the insulation layer is selected from a group consisting of glass epoxy resins (FR-4, FR-5), bismaleimide-triazine (BT) and epoxy resin.

14. The BGA package of claim 9, wherein the chip, the thermal ball pads and the heat dissipation ring are electrically connected together and the contact points of the first thermal balls and the second thermal balls are connected to a ground.

15. The BGA package of claim 9, wherein the chip, the thermal ball pads and the heat dissipation ring are electrically connected together and the contact points of the first thermal balls and the second thermal balls are connected to a power source.

* * * * *